United States Patent [19]
Hübner

[11] Patent Number: 5,902,118
[45] Date of Patent: May 11, 1999

[54] METHOD FOR PRODUCTION OF A THREE-DIMENSIONAL CIRCUIT ARRANGEMENT

[75] Inventor: Holger Hübner, Baldham, Germany

[73] Assignee: Siemens Aktiengesellschaft, Munich, Germany

[21] Appl. No.: 08/765,088

[22] PCT Filed: Jul. 3, 1995

[86] PCT No.: PCT/DE95/00857

§ 371 Date: Dec. 20, 1996

§ 102(e) Date: Dec. 20, 1996

[87] PCT Pub. No.: WO96/01497

PCT Pub. Date: Jan. 18, 1996

[30] Foreign Application Priority Data

Jul. 5, 1994 [DE] Germany ............................ 44 23 566

[51] Int. Cl.[6] .................................................. H01L 21/44
[52] U.S. Cl. .................... 438/106; 408/107; 408/118; 408/455; 408/459
[58] Field of Search .................................. 438/107, 108, 438/109, 118, 455, 459, 612, 106

[56] References Cited

U.S. PATENT DOCUMENTS

| 4,675,717 | 6/1987 | Herero et al. . | |
| 5,270,261 | 12/1993 | Bertin et al. | 438/109 |
| 5,419,806 | 5/1995 | Huebner | 438/107 |
| 5,426,072 | 6/1995 | Finnila | 438/107 |
| 5,496,743 | 3/1996 | Luryi | 438/118 |

FOREIGN PATENT DOCUMENTS

| 0 238 089 | 9/1987 | European Pat. Off. . |
| 0 368 743 A2 | 5/1990 | European Pat. Off. . |
| 0 531 723 A1 | 3/1993 | European Pat. Off. . |
| 36 07 093 A1 | 9/1986 | Germany . |
| 1 304 591 | 1/1973 | United Kingdom . |

OTHER PUBLICATIONS

IEDM Techn. Dig. (1984), Promising New Fabrication Process Developed for Stacked LSI's, M. Yasumoto et al, pp. 816–819. No Month.

VLSI Technology, 1990 Symposium on VLSI Technology, Digest of Technical Papers, Fabrication of Three–Dimensional IC Using "Cumulatively Bonded IC" (CUBIC) Technology, Y. Hayashi et al, pp. 95–96. No Month.

*Primary Examiner*—Tuan H. Nguyen
*Attorney, Agent, or Firm*—Hill & Simpson

[57] ABSTRACT

In order to produce a three-dimensional circuit arrangement, two substrates (21, 26) which have components in the region of their boundary surfaces (22, 27) which touch one another are stacked one on top of the other. The substrates (21, 26) are firmly connected to one another via these boundary surfaces (22, 27). One of the substrates (21) can subsequently be thinned from the rear side (212) and can be provided with rear-side contacts (213), the other substrate (26) acting as a stabilizing supporting plate.

27 Claims, 3 Drawing Sheets

METHOD FOR PRODUCTION OF A THREE-DIMENSIONAL CIRCUIT ARRANGEMENT

BACKGROUND OF THE INVENTION

Semiconductor circuits are increasingly being designed in which integrated circuits are stacked one above the other in a plurality of levels and are connected to one another. In particular, integrated circuits using different technologies are in this way combined.

Such stacks of different integrated circuits are combined in one chip casing, in particular in order to increase the packing density and to shorten the connecting paths. In this case, the substrates which contain the integrated circuits, may be composed of different substrate materials and/or may be manufactured using different technologies are in each case ground to a thickness of less than 10 μm and are arranged as a stack. Contacts are formed in the vertical direction through the substrates. When viewed from the outside, such a component stack looks like a new semiconductor module. It can be implemented in a standard casing with a reduced number of connections, even though it has increased functionality.

Y. Hayashi et al., Symp. on VLSI Techn. (1990), pages 95 to 96, discloses a substrate being bonded by the front side, which comprises an integrated circuit, onto a stabilizing supporting plate in order to form a three-dimensional circuit. The substrate is subsequently ground to a thickness of less than 10 μm from the rear side. Large-area depressions are produced in the rear side in order to make contact in a substrate which is adjacent in the stack, and these depressions are filled with a gold/indium alloy. The substrate is now stacked onto the adjacent substrate such that the rear side of the first substrate is adjacent to the front side, which comprises integrated circuits, of the second substrate. Tungsten pins are arranged in the front side of the second substrate and extend into the depressions, which are filled with the gold/indium alloy, as a result of which vertical contacts are implemented between the adjacent substrates. A polyimide layer is used as the adhesive layer in order to connect the two substrates mechanically.

The stabilizing supporting plate must subsequently be removed again in an expensive and risky process.

SUMMARY OF THE INVENTION

The invention is based on the problem of specifying a method for production of a three-dimensional circuit arrangement, in which the risky removal of a supporting plate is avoided.

In general terms the present invention is a method for production of a three-dimensional circuit arrangement.

An unthinned first substrate has in the region of a first main surface at least one first component having first contacts. An unthinned second substrate has in the region of a second main surface at least one second component having second contacts. The first and second substrates are joined together to form a stack such that the first main surface touches the second main surface and such that at least one first contact and one second contact touch one another. At least one of the main surfaces is provided with an adhesive layer via which the first substrate and the second substrate are firmly connected to one another. At least one of the substrates is provided with electrical connections. The first substrate is thinned from a rear side opposite the first main surface, the second substrate acting as a stabilizing supporting plate. Contact holes to the first component are opened in the rear side and are provided with rear-side contacts.

Advantageous developments of the present invention are as follows.

Metal surfaces are applied to at least one of the main surfaces. Solder metal is applied as the adhesive layer to the metal surfaces. The metal surfaces are soldered by heating to the adjacent main surface of the other substrate. Tungsten or nickel is used for the metal surfaces and gallium or indium is used for the solder metal. Additional metal surfaces which are in each case adjacent to one of the first-mentioned metal surfaces, are applied to the main surface of the respectively other substrate. The first-mentioned metal surfaces are soldered to the adjacent additional metal surfaces. At least one metal surface is formed for electrical connection of contacts in the first substrate and in the second substrate, which do not touch one another in the region of the main surfaces which are adjacent to one another, such that the metal surface forms a conductor track between the two contacts. After the production of the rear-side contacts, the stack comprising the first substrate and the second substrate is joined together with a third substrate which, in the region of a third main surface, has at least one third component having third contacts, such that the third main surface touches the rear side and such that at least the third contact touches the rear-side contact. At least the rear side or the third main surface is provided with an adhesive layer via which the third substrate is firmly connected to the stack. The stack comprising the first substrate and the second substrate is joined together with an identical stack comprising the first substrate and the second substrate such that the rear sides touch one another and such that an electrical connection is produced between the rear-side contacts. An adhesive layer is applied at least to one of the rear sides, via which adhesive layer the two stacks are firmly connected to one another.

The term "substrate" is used here both for substrate wafers, which are composed in particular of semiconductor material and comprise microelectronic circuit structures and/or optoelectronic components and/or sensor components, as well as for discrete components, optoelectronic components, sensor elements or the like.

The term "component" is used both for microelectronic circuit structures and for optoelectronic components, sensor components or the like.

In semiconductor technology, a multiplicity of components are generally produced simultaneously in one substrate wafer. These components are in this case formed in a main surface of the substrate wafer. The majority of the volume of the substrate wafer in this case remains unused and serves only for mechanical stabilization. The component depths are typically 5 μm.

In the method according to the invention, a three-dimensional circuit arrangement is implemented such that at least two adjacent substrates are stacked one on top of the other such that the main surfaces, which comprise components, of both substrates touch one another. The electrical connection between the two substrates is implemented directly via contacts, which touch one another, of the components which are in each case to be connected. In this method, it is therefore unnecessary to thin one of the substrates before joining them together to form the stack. This also obviates the requirement for bonding a stabilizing supporting plate onto a main surface which comprises active components.

If a three-dimensional circuit arrangement having more than two component planes is designed, one of the substrates must be thinned and must be provided with rear-side contacts. In the method according to the invention, the other substrate, which is firmly connected to the substrate to be thinned, in this case acts as the stabilizing supporting plate.

In order to design relatively complex three-dimensional circuit arrangements having more than two component planes, it is within the scope of the invention to apply the stack, after thinning and after the production of rear-side contacts, to a main plane, comprising components, of a further substrate, and to connect it firmly thereto.

Alternatively, the stack produced according to the invention and comprising two substrates can be joined together with a further stack produced according to the invention and comprising two substrates, the rear-side contacts of the thinned main surfaces of the stacks in each case touching one another. The vertical electrical connection is in this case implemented via contacts which touch one another.

In the method according to the invention, the mechanical connection between adjacent substrates is produced via an adhesive layer. A polyimide layer, for example, is suitable as the adhesive layer, which is designed such that contacts which are to be electrically connected touch one another.

The mechanical connection between adjacent substrates is preferably implemented via metal surfaces onto which solder metal is applied as the adhesive layer. The metal surfaces are then soldered to the adjacent main surface of the other substrate by heating.

Contacts which touch one another in the respective substrates can in this case likewise be soldered to one another.

A major advantage in the use of the metal surfaces for the firm connection of adjacent substrates is that this ensures additional dissipation of the heat losses which occur to an increased extent in three-dimensional circuit arrangements because of the increased packing density. Furthermore, the metal surfaces can be designed such that they can be used as a conductor track between contacts in the adjacent substrates which do not touch one another directly. In this way, vertical contacts can also be implemented between those contacts which do not directly touch one another.

By appropriate selection of the materials for the metal surfaces and the solder metal, an alloy can be produced during soldering whose melting point is higher than the melting point of the solder metal, than the operating temperature of the three-dimensional circuit arrangement and than temperatures which occur during the further processing of the circuit arrangement. In this way, etching or separation of the firm connection during the further process steps is avoided. It is within the scope of the invention for tungsten or nickel to be used for the metal surfaces in this case, and for gallium or indium to be used for the solder metal.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
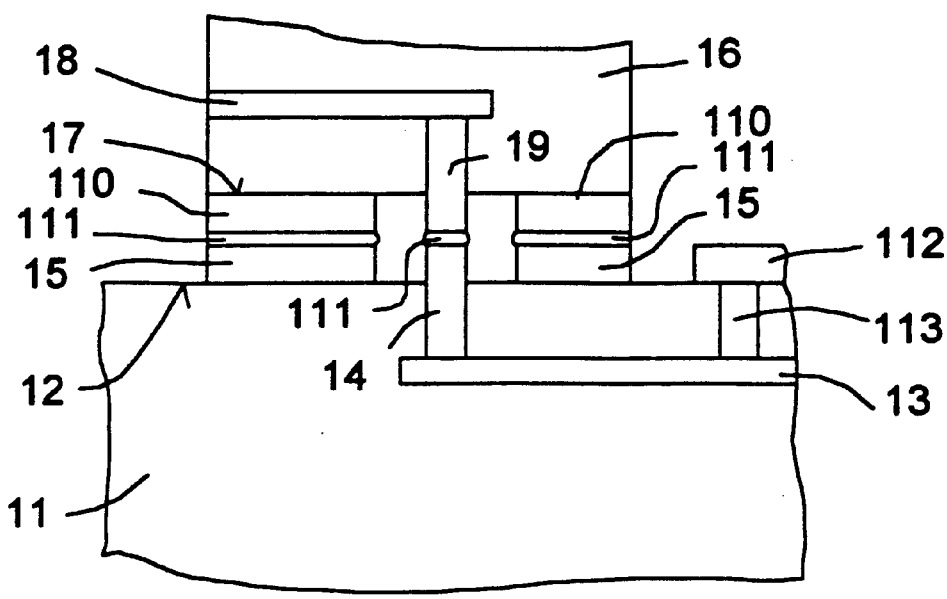
FIG. 1 shows a discrete component which is connected to a substrate wafer.

A first substrate 11 (see FIG. 1), which is, for example, a substrate wafer composed of monocrystalline silicon or a III–V semiconductor, comprises circuit structures which are a component of a microelectronic circuit, of an optoelectronic component or of a sensor component. The circuit structures, which are not illustrated in detail in FIG. 1, comprise at least one first metallization plane 13, which is insulated by insulating material, for example SiO2, from the first substrate 11 (not illustrated). A first contact 14 extends from the first main surface 12 to the first metallization plane 13. First metal surfaces 15 composed, for example, of tungsten are arranged on the first main surface 12 and are formed, for example, by CVD deposition over the entire surface and subsequent structuring of a tungsten layer.

A second substrate 16, which is, for example, a discrete component, comprises in the region of a second main surface 17 circuit structures which are components of a microelectronic circuit, of an optoelectronic component or of a sensor component. The circuit structures, which are not illustrated in detail in FIG. 1, comprise at least one second metallization plane 18, which is insulated by insulating material, for example SiO2, from the second substrate 16 (not illustrated). A second contact 19, which leads to the second main plane 17, extends onto the second metallization plane 18. Arranged on the second main surface are second metal surfaces 110, which are formed, for example, by sputtering over the entire surface and subsequent structuring of a nickel layer.

The first substrate 11 and the second substrate 16 are joined together such that the first main surface 12 and the second main surface 17 touch one another. A solder metal layer 111 is applied between the first metal surfaces 15 and the second metal surfaces 110. The solder metal layer 111 is also applied to the first contact 14 and the second contact 19.

Gallium is used, for example, as the solder metal layer 111. The layer thickness of the solder metal layer 111 is preferably adapted such that the gallium component in the nickel after soldering remains less than 25 percent by weight. The alloy produced during soldering then has a melting point of above 1200° C. If the thickness of the metal surfaces is in the region of 1 to 2 µm, this is the case with a layer thickness of solder metal 111 of a maximum of 0.5 µm.

The arrangement is heated to about 100° C., so that the solder metal layer 112 melts and the first metal surfaces 15 are soldered to the second metal surfaces 110.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

Since the first substrate 11 is a semiconductor wafer, but the second substrate 16 is a discrete component, a connection 112 can be produced on the first main surface 12 of the first substrate 11 to the first metallization plane 13. This is done by opening a contact hole in the first main surface 12 and providing this contact hole with a connecting contact 113.

After the two substrates 11, 16 have been joined together and connected, the second substrate 16 is thinned on a main surface opposite the second main surface 17 (not illustrated). The first substrate 11 at the same time acts as a stabilizing supporting plate.

Before the first substrate 11 and the second substrate 16 are joined together, it is advantageous to test each of the circuit structures in the substrates 11, 16 and to join functioning circuit structures together in each case. This increases the effective yield in the production of the three-dimensionally integrated circuit arrangement.

Figure 2:
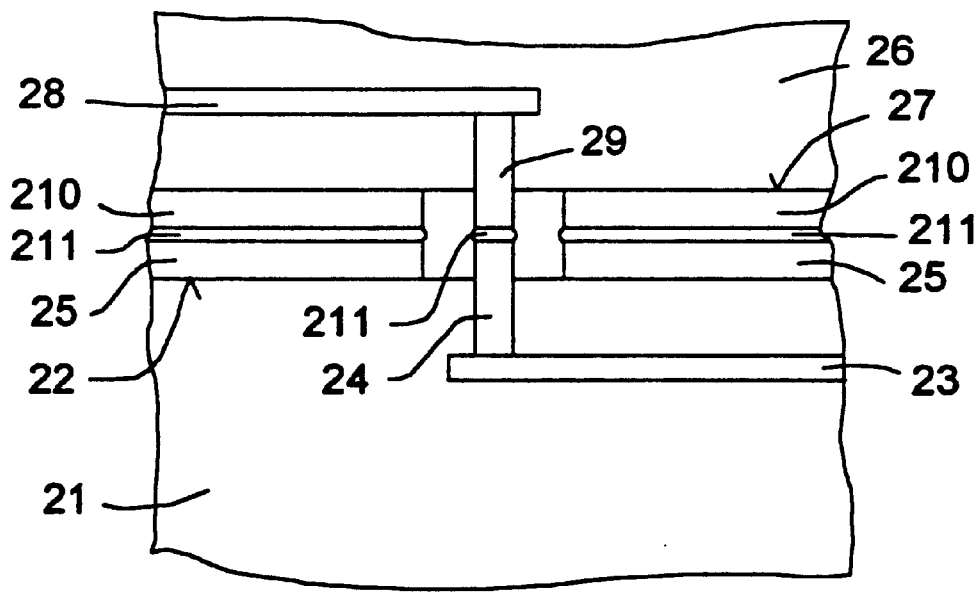
FIG. 2 shows two substrate wafers which are connected to one another via metal surfaces.

A first substrate 21 (see FIG. 2), which, for example, is a semiconductor wafer composed of monocrystalline silicon or a III–V semiconductor, comprises in the region of a first main surface 22 circuit structures which are a component of a microelectronic circuit, of an optoelectronic component or of a sensor component. The circuit structures, which are not illustrated in detail in FIG. 2, comprise at least one first metallization plane 23 which is insulated by insulating material, for example SiO2 (not illustrated), from the first substrate 21. A first contact 24 extends from the first main surface 22 to the first metallization plane 23. First metal surfaces 25 are arranged on the first main surface 22 and are formed, for example, by CVD deposition of tungsten over the entire surface, and subsequent structuring.

A second substrate 26, which is, for example, a semiconductor wafer composed of monocrystalline silicon or a III–V semiconductor, comprises in the region of a second main surface 27 circuit structures which are a component of a microelectronic circuit, of an optoelectronic component or of a sensor component. The circuit structures, which are not illustrated in detail in FIG. 2, comprise at least one second metallization plane 28, which is insulated by insulating material, for example SiO2 (not illustrated) from the second substrate 26. A second contact 29 extends from the second main surface 27 to the second metallization plane 28. Arranged on the second main surface 27 are metal surfaces 210 which are formed, for example, by CVD deposition and subsequent structuring of a nickel layer.

The first substrate 21 and the second substrate 26 are joined together such that the first metallization surfaces 25 touch the second metallization surfaces 210, and such that the first contact 24 touches the second contact 29. A solder metal layer 211 composed, for example, of gallium or indium is applied between the metal surfaces 25, 210 and the contacts 24, 29. The layer thicknesses are matched to one another as is indicated in FIG. 1. The metal surfaces 25, 210 and the contacts 24, 29 are soldered to one another by heating the arrangement to about 200° C. An electrical connection between the circuit structures in the first substrate 21 and the second substrate 26 is formed via the contacts 24, 29, and a firm mechanical connection between the two substrates is formed via the soldered metal surfaces 25, 210. The metal surfaces 25, 210 at the same time ensure dissipation of the heat losses, which are considerable because of the high packing density.

Before further component levels can be added to the stack formed from the first substrate 21 and the second substrate 26, one of the substrates 21, 26 must be thinned.

Figure 3:
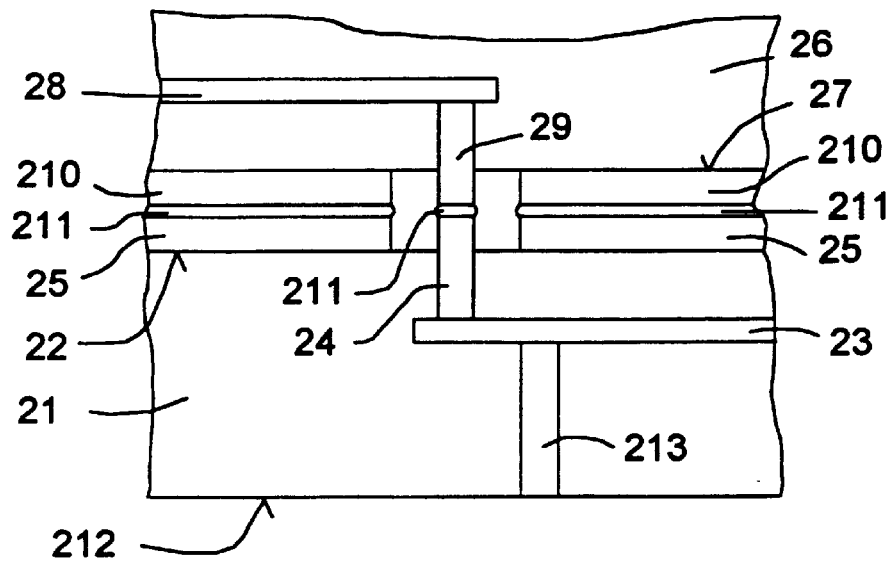
FIG. 3 shows the two substrate wafers, which are connected to one another via metal surfaces, after one substrate wafer has been ground to be thin.

To do this, the first substrate 21 is ground thin on the rear side 212 opposite the first main surface 22, until the thickness of the first substrate is 5 to 20 $\mu$m, preferably 10 $\mu$m (see FIG. 3). During the operation of grinding said substrate thin, the second substrate 26 acts as a stabilizing supporting plate.

A rear-side contact 213 to the first metallization plane 23 is formed from the rear side 212. This is done by etching a contact hole which is filled with metallization composed, for example, of tungsten.

Figure 4:
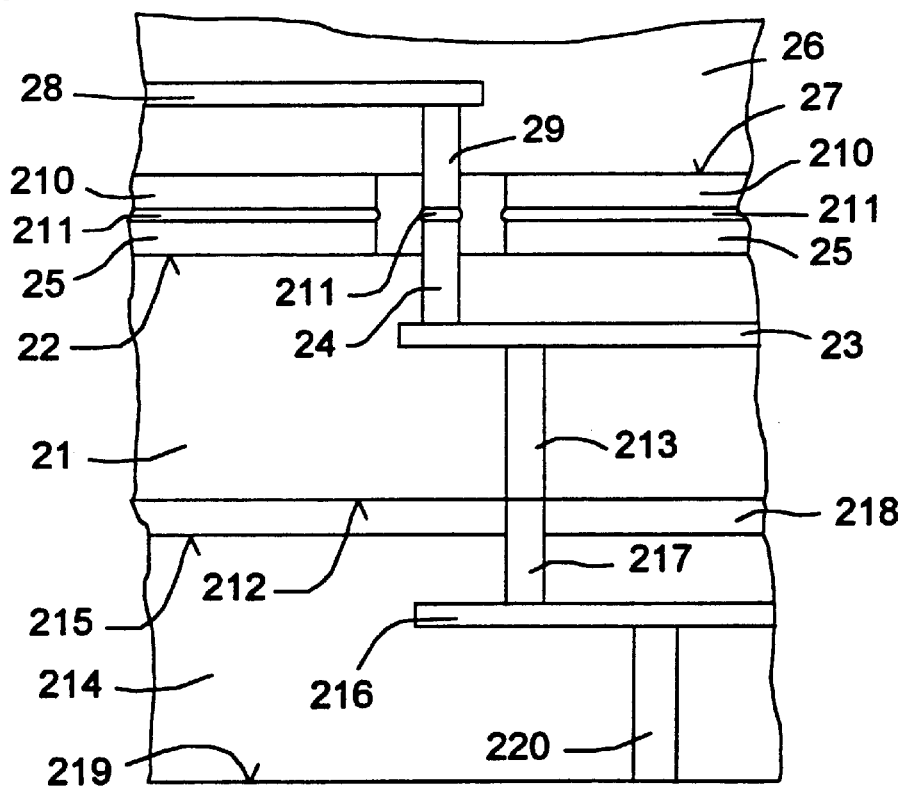
FIG. 4 shows a three-dimensional circuit arrangement having three component levels.

The stack formed from the first substrate 21 and the second substrate 26 is subsequently joined to a third substrate 214 (see FIG. 4). The third substrate 214, which is, for example, a semiconductor wafer composed of monocrystalline silicon or a III–V semiconductor, comprises circuit structures which are a component of a microelectronic circuit, of an optoelectronic component or of a sensor component. The circuit structures, which are not illustrated in detail in FIG. 4, comprise at least one third metallization plane 216, which is insulated by insulating material, for example SiO2 (not illustrated) from the third substrate 214. A third contact 217 extends from the third main surface 215 to the third metallization plane 216.

The third substrate 214 is joined to the stack formed from the first substrate 21 and the second substrate 26, such that the third main plane 215 touches the rear side 212 of the first substrate 21. At the same time, the third contact 217 touches the rear-side contact 213 of the first substrate 21. An adhesive layer 218 composed, for example, of polyimide is applied outside the third contact 217 and the rear-side contact 213, and the third substrate 214 is firmly connected to the first substrate 21 via said adhesive layer 218. The third contact 217 and the rear-side contact 213 are electrically connected to one another by the contacts directly touching one another.

The third substrate 214 is ground thin from a rear side 219, which is opposite the third main surface 215, to 5 to 20 $\mu$m preferably 10 $\mu$m. At the same time, the second substrate 26 once again acts as a stabilizing supporting plate. A rear-side contact 220 is then formed from the rear side 219 to the third metallization plane 216. The rear-side contact 220 can be used as a connection to the three-dimensional circuit arrangement or as a vertical contact to a further component level to be added.

Instead of being firmly connected to the third substrate 214, the stack formed from the first substrate 22 and the second substrate 26 can be firmly connected to a second stack (see FIG. 5), which comprises a first substrate 21' having a first metallization plane 23' of a first main surface 22', having a first contact 24' and first metal surfaces 25', as well as a second substrate 26' having a second main plane 27', a second metallization plane 28', a second contact 29' and second metal surfaces 210'. In this case, the first substrate 21' and the second substrate 26' are of analogous design to the first substrate 21 and the second substrate 26. In accordance with the method according to the invention, as has been explained with reference to FIG. 2 for the first substrate 21 and the second substrate 26, the first substrate 21' and the second substrate 26' are firmly connected to one another via a solder metal layer 211'. The contacts 24' and 29' are firmly and electrically connected to one another in the same way via the solder metal layer 211'.

The first substrate 21' is ground thin from a rear side 212', which is opposite the first main surface 22', as explained using FIG. 3 with reference to the first substrate 21. A rear-side contact 213' is then produced from the rear side 212' to the first metallization plane 22'. The two essentially identical stacks 21, 26 and 21', 26' are now firmly connected to one another via an adhesive layer 221 composed, for example, of polyimide. In this case, the rear sides 212 and 212' as well as the rear-side contacts 213, 213' touch one another. The electrical connection between the rear-side contacts 213, 213' is implemented, for example, by means of a metal surface 222 which is arranged in between and is composed, for example, of solder metal. Alternatively, the stacks 21, 26 and 21', 26' can also be connected to one another via metal surfaces and solder metal.

Figure 5:
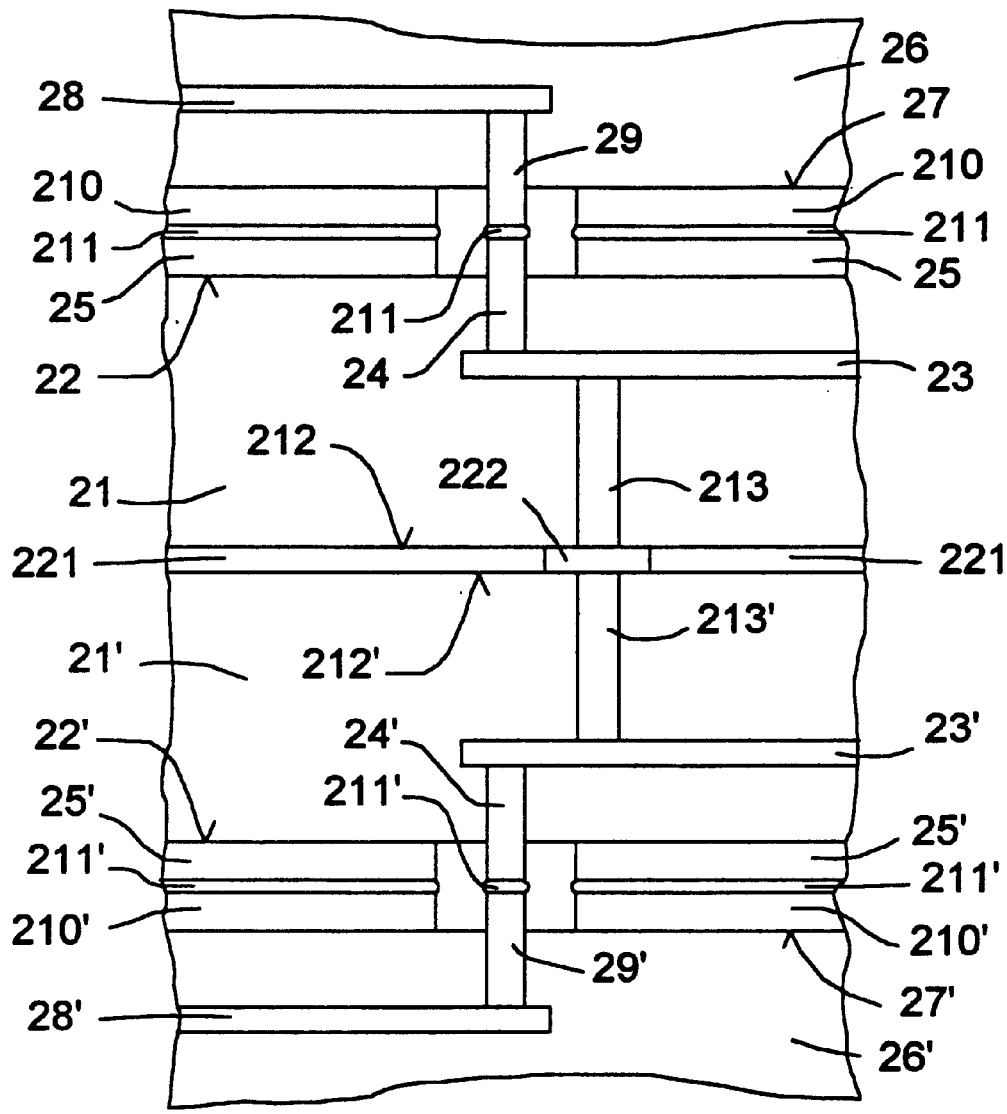
FIG. 5 shows a three-dimensional circuit arrangement having four component levels.

On the basis of the stack which has been described with reference to FIG. 5 and comprises four substrate wafers, a three-dimensional circuit arrangement can still be implemented with any desired number of component levels by successively carrying out the process steps described with reference to FIG. 3 and FIGS. 4 or 5.

The essential feature for the method according to the invention is that no additional, bonded-on supporting plate whatsoever is required for the grinding-thin processes, since, in the method according to the invention, the substrates are joined together over their full thickness. Substrate wafers have thicknesses of about 650 µm in silicon process engineering.

Since the substrates which are to be joined together are not thinned, adjustment via the rear side of the substrates is not possible. The main surfaces, to be joined together, of the substrates must, however, be adjusted with respect to one another such that corresponding contacts or metal surfaces touch one another. A split-field microscope is preferably used for this purpose. In such a split-field microscope, the substrates to be adjusted with respect to one another are arranged in a high-precision mechanism at a distance of about 15 cm apart. A prism is introduced between the two substrates, via which images of both substrate surfaces are produced. These substrate surfaces are now adjusted with respect to one another such that the images are superimposed. After completion of the adjustment process, the prism is moved out and the substrates are moved together via the precision mechanism. The method according to the invention has been tested using a split-field microscope which is commercially available. The split-field microscope used, from the Süß Company, Garching, allows substrate wafers to be adjusted with an adjustment accuracy of 3 µm.

What is claimed is:

1. A method for production of a three-dimensional circuit arrangement, comprising the steps of:

providing a first substrate having in a region of a first main surface thereof at least one first component having first contacts, and a second substrate, having in a region of a second main surface at least one second component having second contacts;

joining the first and second substrates together to form a stack such that the first main surface touches the second main surface and such that at least one first contact and one second contact touch one another;

providing at least one of the main surfaces with an adhesive layer via which the first substrate and the second substrate are firmly connected to one another;

providing at least one substrate of the first and second substrates with electrical connections;

thinning the first substrate from a rear side thereof opposite the first main surface, the second substrate acting as a stabilizing supporting plate; and opening contact holes to the at least one first component in the rear side and providing the contact holes with rear-side contacts.

2. The method as claimed in claim 1, wherein first metal surfaces are applied to at least one of the first and second main surfaces, wherein solder metal is applied as the adhesive layer to the first metal surfaces, wherein the metal surfaces are soldered by heating to the adjacent main surface of the other substrate of the first and second substrates.

3. The method as claimed in claim 2, wherein one of tungsten or nickel is used for the metal surfaces and wherein one of gallium or indium is used for the solder metal.

4. The method as claimed in claim 2, wherein additional metal surfaces which are respectively adjacent to the first metal surfaces, are applied to the other main surface of the first and second main surfaces, wherein the first-mentioned metal surfaces are soldered to the adjacent additional metal surfaces.

5. The method as claimed in claim 2, wherein at least one further metal surface is formed for electrical connection of contacts in the first substrate and in the second substrate, which do not touch one another in a region of the main surfaces which are adjacent to one another, such that said further metal surface forms a conductor track between the two contacts.

6. The method as claimed in claim 1, wherein after production of the rear-side contacts, the stack having the first substrate and the second substrate is joined together with a third substrate which, in a region of a third main surface thereof, has at least one third component having third contacts, such that the third main surface touches the rear side of the first substrate and such that at least the third contact touches the rear-side contact, wherein at least one of the rear side of the first substrate and the third main surface is provided with an adhesive layer via which the third substrate is firmly connected to the stack.

7. The method as claimed in claim 1, wherein the stack comprising the first substrate and the second substrate is joined together with an identical stack comprising a further first substrate and a further second substrate such that rear sides of the first substrate and the further first substrate touch one another and such that an electrical connection is produced between rear-side contacts of the first substrate and the further first substrate a further adhesive layer being applied at least to one of the rear sides of the first substrate and the further first substrate, via which further adhesive layer the two stacks are firmly connected to one another.

8. A method for production of a three-dimensional circuit arrangement, comprising the steps of:

providing a first substrate having in a region of a first main surface thereof at least one first component having first contacts, and a second substrate, having in a region of a second main surface at least one second component having second contacts;

joining the first and second substrates together to form a stack such that the first main surface touches the second main surface and such that at least one first contact and one second contact touch one another;

providing at least one of the main surfaces with an adhesive layer via which the first substrate and the second substrate are firmly connected to one another;

providing at least one substrate of the first and second substrates with electrical connections;

thinning the first substrate from a rear side thereof opposite the first main surface, the second substrate acting as a stabilizing supporting plate;

opening contact holes to the at least one first component in the rear side and providing the contact holes with rear-side contacts;

joining together the stack having the first substrate and the second substrate with a third substrate which, in a region of a third main surface thereof, has at least one third component having third contacts, such that the third main surface touches the rear side of the first substrate and such that at least the third contact touches the rear-side contact; and providing at least one of the rear side of the first substrate and the third main surface with an adhesive layer via which the third substrate is firmly connected to the stack.

9. The method as claimed in claim 8, wherein first metal surfaces are applied to at least one of the first and second main surfaces, wherein solder metal is applied as the adhesive layer to the first metal surfaces, wherein the metal surfaces are soldered by heating to the adjacent main surface of the other substrate of the first and second substrates.

10. The method as claimed in claim 9, wherein one of tungsten or nickel is used for the metal surfaces and wherein one of gallium or indium is used for the solder metal.

11. The method as claimed in claim 9, wherein additional metal surfaces which are respectively adjacent to the first metal surfaces, are applied to the other main surface of the first and second main surfaces, wherein the first-mentioned metal surfaces are soldered to the adjacent additional metal surfaces.

12. The method as claimed in claim 9, wherein at least one further metal surface is formed for electrical connection of contacts in the first substrate and in the second substrate, which do not touch one another in a region of the main surfaces which are adjacent to one another, such that said further metal surface forms a conductor track between the two contacts.

13. A method for production of a three-dimensional circuit arrangement, comprising the steps of:

providing a first substrate having in a region of a first main surface thereof at least one first component having first contacts, and a second substrate, having in a region of a second main surface at least one second component having second contacts;

joining together the stack having the first substrate and the second substrate with an identical stack having a further first substrate and a further second substrate such that rear sides of the first substrate and the further first substrate touch one another and such that an electrical connection is produced between rear-side contacts of the first substrate and the further first substrate, a further adhesive layer being applied at least to one of the rear sides of the first substrate and the further first substrate, via which further adhesive layer and the two stacks are firmly connected to one another;

thinning the first substrate from a rear side thereof opposite the first main surface, the second substrate acting as a stabilizing supporting plate; and opening contact holes to the at least one first component in the rear side and providing the contact holes with the rear-side contacts.

14. The method as claimed in claim 13, wherein first metal surfaces are applied to at least one of the first and second main surfaces, wherein solder metal is applied as the adhesive layer to the first metal surfaces, wherein the metal surfaces are soldered by heating to the adjacent main surface of the other substrate of the first and second substrates.

15. The method as claimed in claim 14, wherein one of tungsten or nickel is used for the metal surfaces and wherein one of gallium or indium is used for the solder metal.

16. The method as claimed in claim 14, wherein additional metal surfaces which are respectively adjacent to the first metal surfaces, are applied to the other main surface of the first and second main surfaces, wherein the first-mentioned metal surfaces are soldered to the adjacent additional metal surfaces.

17. The method as claimed in claim 14, wherein at least one further metal surface is formed for electrical connection of contacts in the first substrate and in the second substrate, which do not touch one another in a region of the main surfaces which are adjacent to one another, such that said further metal surface forms a conductor track between the two contacts.

18. A method for production of a three-dimensional circuit arrangement, comprising the steps of:

providing a first substrate having in a region of a first main surface thereof at least one first component having first contacts, and a second substrate, having in a region of a second main surface at least one second component having second contacts;

applying first metal surfaces to at least one of the first and second main surfaces;

applying solder metal as an adhesive layer to the first metal surfaces;

soldering together the first and second substrates together by heating to the adjacent main surface of the other substrate of the first and second substrates to form a stack such that the first main surface touches the second main surface and such that at least one first contact and one second contact tough one another;

providing at least one substrate of the first and second substrates with electrical connections;

thinning the first substrate from a rear side thereof opposite the first main surface, the second substrate acting as a stabilizing supporting plate; and opening contact holes to the at least one first component in the rear side and providing the contact holes with rear-side contacts.

19. The method as claimed in claim 18, wherein one of tungsten or nickel is used for the metal surfaces and wherein one of gallium or indium is used for the solder metal.

20. The method as claimed in claim 18, wherein additional metal surfaces which are respectively adjacent to the first metal surfaces, are applied to the other main surface of the first and second main surfaces, wherein the first-mentioned metal surfaces are soldered to the adjacent additional metal surfaces.

21. The method as claimed in claim 18, wherein at least one further metal surface is formed for electrical connection of contacts in the first substrate and in the second substrate, which do not touch one another in a region of the main surfaces which are adjacent to one another, such that said further metal surface forms a conductor track between the two contacts.

22. The method as claimed in claim 18, wherein the stack having the first substrate and the second substrate is joined together with an identical stack having a further first substrate and a further second substrate such that rear sides of the first substrate and the further first substrate touch one another and such that an electrical connection is produced between rear-side contacts of the first substrate and the further first substrate, a further adhesive layer being applied at least to one of the rear sides of the first substrate and the further first substrate, via which further adhesive layer the two stacks are firmly connected to one another.

23. A method for production of a three-dimensional circuit arrangement, comprising the steps of:

provinding a first substrate having in a region of a first main surface thereof at least one first component having first contacts, and a second substrate, having in a region of a second main surface at least one second component having second contacts;

applying first metal surfaces to at least one of the first and second main surfaces;

applying solder metal as an adhesive layer to the first metal surfaces;

forming at least one further metal surface for electrical connection of contacts in the first substrate and in the second substrate, which do not touch one another in a region of the main surfaces which are adjacent to one another, such that said further metal surface forms a conductor track between the two contacts;

soldering the first and second substrates together by heating to the adjacent main surface of the other substrate of the first and second substrates to form a stack such that the first main surface touches the second main surface and such that at least one first contact and one second contact touch one another;

providing at least one substrate of the first and second substrates with electrical connections;

thinning the first substrate from a rear side thereof opposite the first main surface, the second substrate acting as a stabilizing supporting plate; and opening contact holes to the at least one first component in the rear side and providing the contact holes with rear-side contacts.

24. The method as claimed in claim 23, wherein one of tungsten or nickel is used for the metal surfaces and wherein one of gallium or indium is used for the solder metal.

25. The method as claimed in claim 23, wherein additional metal surfaces which are respectively adjacent to the first metal surfaces, are applied to the other main surface of the first and second main surfaces, wherein the first-mentioned metal surfaces are soldered to the adjacent additional metal surfaces.

26. The method as claimed in claim 23, wherein after production of the rear-side contacts, the stack having the first substrate and the second substrate is joined together with a third substrate which, in a region of a third main surface thereof, has at least one third component having third contacts, such that the third main surface touches the rear side of the first substrate and such that at least the third contact touches the rear-side contact, wherein at least one of the rear side of the first substrate and the third main surface is provided with an adhesive layer via which the third substrate is firmly connected to the stack.

27. The method as claimed in claim 23, wherein the stack having the first substrate and the second substrate is joined together with an identical stack having a further first substrate and a further second substrate such that rear sides of the first substrate and the further first substrate touch one another and such that an electrical connection is produced between rear-side contacts of the first substrate and the further first substrate, a further adhesive layer being applied at least to one of the rear sides of the first substrate and the further first substrate, via which further adhesive layer the two stacks are firmly connected to one another.

* * * * *